United States Patent
Ikeda

(10) Patent No.: US 9,740,220 B2
(45) Date of Patent: Aug. 22, 2017

(54) DEVICE HAVING INTERNAL VOLTAGE GENERATING CIRCUIT

(71) Applicant: Micron Technology, Inc., Boise, ID (US)

(72) Inventor: Yutaka Ikeda, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 14/608,062

(22) Filed: Jan. 28, 2015

(65) Prior Publication Data

US 2015/0338863 A1   Nov. 26, 2015

(30) Foreign Application Priority Data

May 20, 2014   (JP) .................................. 2014-104003

(51) Int. Cl.
| | |
|---|---|
| G05F 1/46 | (2006.01) |
| G11C 5/14 | (2006.01) |
| G05F 1/56 | (2006.01) |
| G05F 1/575 | (2006.01) |

(52) U.S. Cl.
CPC ............... *G05F 1/461* (2013.01); *G05F 1/56* (2013.01); *G05F 1/575* (2013.01); *G11C 5/147* (2013.01)

(58) Field of Classification Search
CPC ..................................................... G05F 1/461
See application file for complete search history.

(56) References Cited

U.S. PATENT DOCUMENTS

| | | | | | |
|---|---|---|---|---|---|
| 5,633,637 | A | * | 5/1997 | Noro ..................... | H03M 1/765 341/118 |
| 5,694,366 | A | * | 12/1997 | Chevallier ............. | G11C 5/143 330/282 |
| 6,403,943 | B2 | * | 6/2002 | Wada ................... | H03G 1/0088 250/214 A |
| 6,498,469 | B2 | * | 12/2002 | Kobayashi ............. | G05F 1/465 323/313 |
| 7,050,028 | B2 | * | 5/2006 | Morita ................. | G09G 3/2011 345/690 |
| 7,619,402 | B1 | * | 11/2009 | Kwong ................... | G05F 1/575 323/297 |
| 7,965,065 | B2 | * | 6/2011 | Hirota .................... | G11C 17/18 323/233 |
| 8,278,996 | B2 | * | 10/2012 | Miki ...................... | G11C 5/147 327/103 |
| 8,461,903 | B1 | * | 6/2013 | Granger-Jones ....... | H03K 17/04 327/427 |
| 9,236,799 | B2 | * | 1/2016 | Huang ................... | G11C 5/147 |

(Continued)

FOREIGN PATENT DOCUMENTS

JP       2000-029552       1/2000

*Primary Examiner* — Emily P Pham
(74) *Attorney, Agent, or Firm* — Dorsey & Whitney LLP

(57) ABSTRACT

A device includes an amplifying circuit having first and second input terminals and an output terminal, a ground terminal, a variable resistance circuit, and a resistance selecting circuit coupled in series to the variable resistance circuit between the output terminal and the ground terminal. The resistance selecting circuit includes a first node coupled to the second input terminal, a plurality of resistors coupled in series to each other and a plurality of gate circuits each coupled between the first node and one end of a corresponding one of the resistors.

15 Claims, 8 Drawing Sheets

(56) References Cited

U.S. PATENT DOCUMENTS

2009/0128120 A1* 5/2009 Tatsuda .............. H01L 27/0629
  323/351
2013/0300496 A1* 11/2013 Jung ........................ G05F 3/02
  327/540

* cited by examiner

DEVICE HAVING INTERNAL VOLTAGE GENERATING CIRCUIT

This application is based upon and claims the benefit of priority from Japanese patent application No. 2014-104003 filed on May 20, 2014, the disclosure of which are incorporated herein in its entirely by reference.

BACKGROUND

Field of the Invention

This invention relates to a device, in particular, a device including a reference voltage generating circuit that generates a reference voltage used in the device.

Description of the Related Art

In various semiconductor devices such as DRAMs (Dynamic Random Access Memories), internal voltage generating circuits which generate internal voltages are used. The internal voltage generating circuit generates the internal voltage based on a reference voltage generated from a reference voltage generating circuit. In this case, the reference voltage generating circuit generates a reference voltage by a reference voltage generating circuit included therein and inputs the generated reference voltage to a differential amplifying circuit. The differential amplifying circuit generates a stable reference voltage by amplifying the differential between the input reference voltage and the output of its own circuit fed back with a predetermined gain.

However, due to variations in resistors and transistors in manufacturing processes, variations are generated also in the generated reference voltage. A circuit that finely adjusts the feedback gain in order to absorb such variations in the reference voltage is a voltage adjusting circuit.

A device, which includes a reference voltage generating circuit having a plurality of resistors connected in series to each other and a plurality of gate transistors each coupled to a corresponding one of the resistors for bypassing the resistor, is described in Japanese Patent Application Laid-open No. 2000-029552.

However, each of the gate transistors require sufficient voltage to be supplied between source and drain terminals for bypassing the resister. If sufficient voltage is not supplied to the gate transistor, the gate transistor may not be fully conductive. As a result, the gate transistor may not adequately bypass the resistor or the gate transistor may bypass the resistor, but may have an improper resistance value. As a result, the reference voltage generating circuit may not generate a reference voltage properly. Nowadays the voltage level used in a device tends to be lower than in the past, so it has become more difficult to generate a proper reference voltage.

SUMMARY

In one embodiment, there is provided a device that includes an amplifying circuit having first and second input terminals and an output terminal; a ground terminal; a variable resistance circuit; and a resistance selecting circuit coupled in series to the variable resistance circuit between the output terminal and the ground terminal, the resistance selecting circuit including a first node coupled to the second input terminal, a plurality of resistors coupled in series to each other and a plurality of gate circuits each coupled between the first node and one end of a corresponding one of the resistors.

In another embodiment, there is provided a device that includes an amplifying circuit configured to be supplied with first and second voltages and to generate a third voltage responsive to a voltage comparison of the first and second voltages; a variable resistance circuit configured to be supplied with the third voltage and to supply a fourth voltage different from the third voltage; and a resistance selecting circuit configured to be supplied with the fourth voltage, the resistance selecting circuit further configured to generate a plurality of internal voltages different from each other based on the fourth voltage and to output a selected one of the internal voltages as the second voltage to the amplifying circuit.

In still another embodiment, there is provided a device that includes first, second, third and fourth nodes; a first resistive element coupled between the first and second nodes; a second resistive element coupled between the second and third nodes; a first switch coupled in parallel to the first resistive element; and a second switch coupled between the second and fourth nodes.

According to various embodiments of the present invention, an internal voltage generating circuit and a semiconductor device that contribute to generation of a stable reference voltage is provided.

DETAILED DESCRIPTION OF THE EMBODIMENTS

A first embodiment will be described in detail with reference to the attached drawings.

Figure 2:
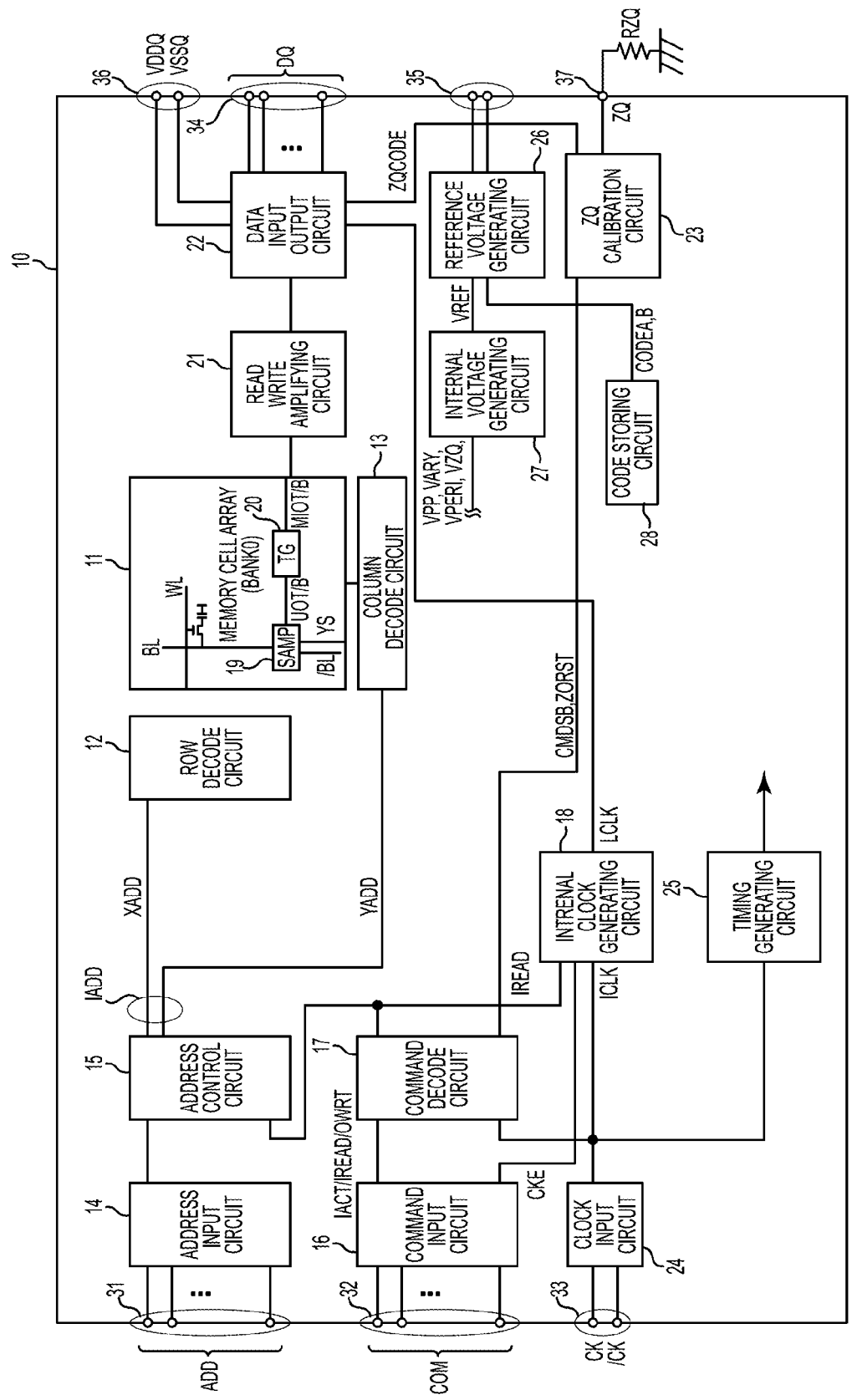
FIG. 2 is a drawing showing an example of the overall configuration of a semiconductor device according to the first embodiment.

FIG. 2 is a block diagram showing a semiconductor device 10 according to an embodiment of the present invention. The semiconductor device 10 has a memory cell array 11. The memory cell array 11 includes memory banks BANK 0 to 7. FIG. 2 shows the memory bank BANK 0, and an illustration of the other memory banks is omitted. Each of the memory banks BANK is provided with a plurality of word lines WL, a plurality of bit lines BL and a plurality of memory cells disposed at intersection points. Selection of the word lines WL is carried out by a row decode circuit 12, and selection of the bit lines BL is carried out by a column decode circuit 13.

The semiconductor device 10 is provided with address terminals 31, command terminals 32, clock terminals 33, data terminals 34, power source terminals 35 and 36 and a calibration terminal 37 as external terminals. Furthermore, the semiconductor device 10 may be provided with test input-output terminals and reset terminals.

Address signals ADD are supplied to the address terminals 31, and external command signals COM are supplied to the command terminals 32. The address signals ADD are latched by an address control circuit 15 via an address input circuit 14. The address control circuit 15 supplies internal address signals IADD to the row decode circuit 12 and the column decode circuit 13.

The external command signals COM are supplied to a command decode circuit 17 via a command input circuit 16. The command decode circuit 17 generates various internal commands by decoding the external command signals COM. The internal commands include an internal active signal IACT, an internal read command IREAD, an internal write command IWRT, an internal calibration command CMDSB, and an internal calibration reset command ZQRST. The command decode circuit 17 supplies the internal read command IREAD to an internal clock generating circuit 18, and the command input circuit 16 supplies a clock enable signal CKE to the internal clock generating circuit 18.

Active command ACT is issued when the external command signals COM represent row access (active command). When the active command ACT is issued, the internal active signal IACT is activated. As a result, a row address XADD latched by the address control circuit 15 is supplied to the row decode circuit 12, and a word line is selected.

When a read command READ or a write command WRT is issued, the internal read command IREAD or the internal write command IWRT is activated. As a result, a column address YADD latched by the address control circuit 15 is supplied to the column decode circuit 13, and a bit line is selected.

Therefore, in a case that the active command ACT and the read command READ are issued in sequence and that a row address and a column address are input in synchronization with them, read data is read from the memory cell specified by the row address and the column address. The read data is subjected to sense amplification by a sense amplifying circuit (SAMP) 19 and is output to a complementary local input-output line LIOT/B. A gate circuit 20 selectively connects the local input-output line LIOT/B to a main input-output line MIOT/B. The read data is output from the data terminal 34 to outside via the main input-output line MIOT/B, a read write amplifying circuit (RWAMP) 21, and a data input-output circuit 22.

In a case that the active command ACT and the write command WRT are issued in sequence that a row address and a column address are input in synchronization with them, and that write data is then input to the data terminal 34, the write data is supplied to the memory cell array 11 via the data input-output circuit 22 and the read write amplifying circuit 21 and is written to the memory cell specified by the row address and the column address.

The internal calibration command CMDSB instructs a ZQ calibration circuit 23 to carry out a ZQ calibration. The internal calibration reset command ZQRST causes the ZQ calibration circuit 23 to be in an inactive state.

External clock signals CK and /CK are input to the clock terminal 33. The external clock signal CK and the external clock signal /CK are mutually complementary signals, and both of them are input to a clock input circuit 24. The external clock signals CK and /CK input to the clock input circuit 24 are supplied to the internal clock generating circuit 18 as an internal clock signal ICLK, and, as a result, an internal clock signal LCLK is generated. The internal clock signal ICLK is supplied also to a timing generating circuit 25, and, as a result, various internal clock signals are generated. The various internal clock signals generated by the timing generating circuit 25 are supplied to circuit blocks such as the address control circuit 15 and regulate operation timing of the circuit blocks.

The power source terminals 35 are the terminals to which power source voltages VDD and VSS (=Ground) are supplied. The power source voltages VDD and VSS supplied to the power source terminals 35 are supplied to a reference voltage generating circuit 26.

The reference voltage generating circuit 26 generates a reference voltage VREF and supplies the reference voltage to an internal voltage generating circuit 27. When the reference voltage VREF is generated, the reference voltage generating circuit 26 references adjustment codes (CODE A, CODE B) stored by a code storing circuit 28 and carries out fine adjustment of the reference voltage VREF in consideration of variations in manufacturing processes.

Especially, the reference voltage generating circuit includes a variable resistance circuit and a resistance selecting circuit coupled to the variable resistance circuit. The resistance selecting circuit includes a plurality of resistors coupled in series to each other and a plurality of gate circuits each coupled to one end of a corresponding one of the resistors.

A selected one of the gate circuits is turned on so that the selected one of the gate circuits supplies an appropriate voltage at a terminal. The reference voltage can be generated properly due to the voltage at the terminal.

The internal voltage generating circuit 27 generates various internal voltages VPP, VARY, VPERI and a reference voltage VZQ based on the supplied reference voltage VREF. The internal voltage VPP is a voltage which is mainly used in the row decode circuit 12 and is a boosted voltage used for activating the word line WL. The internal voltage VARY is a voltage used mainly in the sense amplifying circuit 19 for sense amplification of data read from the memory cell. The internal voltage VPERI is a voltage used in many other circuit blocks (peripheral circuits). The reference voltage VZQ is a reference voltage used in the ZQ calibration circuit 23.

The power source terminals 36 are the terminals to which power source voltages VDDQ and VSSQ are supplied. The power source voltages VDDQ and VSSQ supplied to the power source terminals 36 are supplied to the data input-output circuit 22. The power source voltages VDDQ and VSSQ are the same voltages as the power source voltages VDD and VSS supplied to the power source terminals 35, respectively. However, the dedicated power source voltages VDDQ and VSSQ are used for the data input-output circuit 22 so that power source noise generated by the data input-output circuit 22 does not propagate to the other circuit blocks.

The calibration terminal 37 is connected to the ZQ calibration circuit 23. When the ZQ calibration circuit 23 is activated by the internal calibration command CMDSB, the ZQ calibration circuit 23 references the impedance of an external resistor RZQ and the reference voltage VZQ and carries out a calibration operation. An impedance code ZQCODE obtained by the calibration operation is supplied to the data input-output circuit 22, and, as a result, the impedance of an output buffer (not shown) included in the data input-output circuit 22 is set.

Next, the reference voltage generating circuit 26 will be described.

Figure 3:
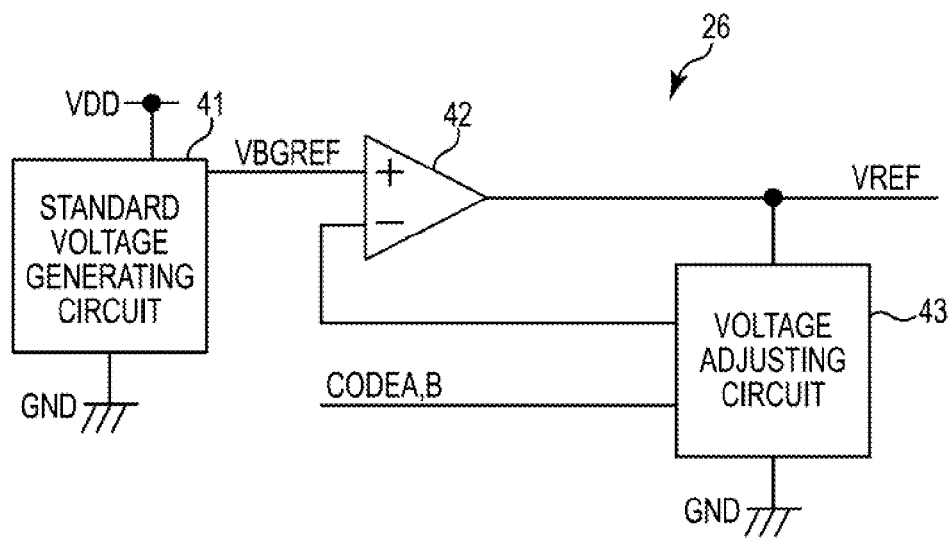
FIG. 3 is a drawing showing an example of the internal configuration of the reference voltage generating circuit.

FIG. 3 is a drawing showing a reference voltage generating circuit 26 according to an embodiment of the invention. In FIG. 3, the reference voltage generating circuit 26 includes a reference voltage generating circuit 41, an amplifying circuit 42, and an adjusting circuit 43.

The reference voltage generating circuit 41 generates a reference voltage VBGREF, which is stable with respect to temperature fluctuations, based on the power source voltages VDD and VSS. The reference voltage VBGREF generated by the reference voltage generating circuit 41 is supplied to a non-inverting input terminal (first input terminal) of the differential amplifying circuit 42. An output voltage from the adjusting circuit 43 is supplied to an inverting input terminal (second input terminal) of the differential amplifying circuit 42.

The differential amplifying circuit 42 outputs the reference voltage VREF. The level of the reference voltage VREF output by the differential amplifying circuit 42 is adjusted by the voltage adjusting circuit 43, and the voltage is fed back to the inverting input terminal.

The voltage adjusting circuit 43 includes a resistor string having a controllable resistance value and provides the reference voltage VREF to the differential amplifying circuit 42 with a predetermined gain. The voltage adjusting circuit 43 switches the resistance value of the resistor string based on the adjustment codes A and B.

The adjustment codes A and B are data, which is obtained by a manufacturing process, etc. of the semiconductor device 10, and are stored in the code storing circuit 28 through the manufacturing process. More specifically, the reference voltage VREF is observed in the manufacturing process, etc., and the adjustment codes A and B to be stored in the code storing circuit 28 are calculated from the observed reference voltage VREF. Alternatively, code input to the voltage adjusting circuit 43 from outside the semiconductor device 10 may be configured to be enabled, and the adjustment codes A and B with which the reference voltage VREF becomes a predetermined value (design value) may be stored in the code storing circuit 28. This code storing circuit 28 may include laser trimming fuses or electrical fuses.

Figure 4:
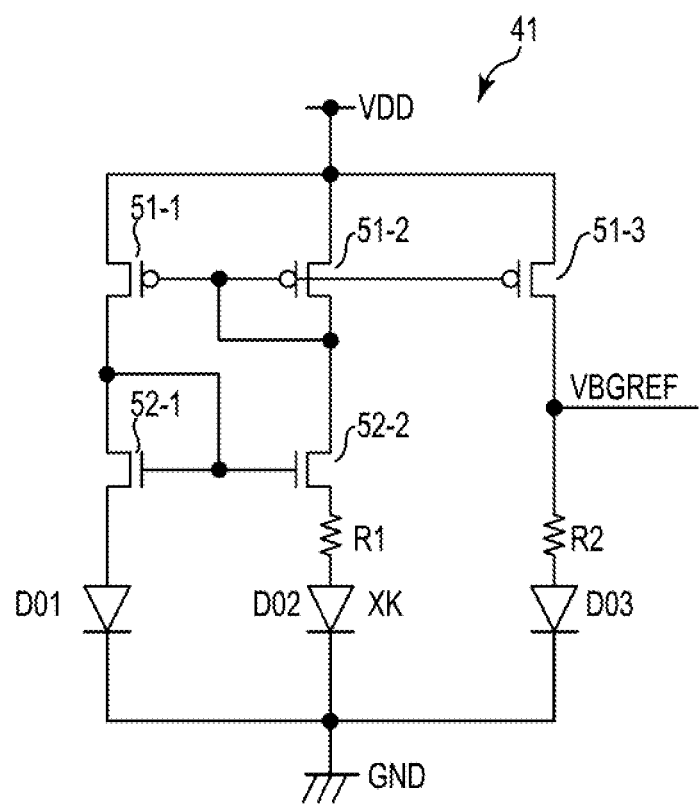
FIG. 4 is a drawing showing an example of the circuit configuration of a reference voltage generating circuit.

FIG. 4 is a drawing showing a reference voltage generating circuit 41 according to an embodiment of the invention. The reference voltage generating circuit 41 includes P-channel-type MOS transistors 51-1 to 51-3, N-channel-type MOS transistors 52-1 and 52-2, diodes D01 to D03, and resistances R01 and R02. The diode D02 shown in FIG. 4 is K (K is an integer of 2 or more, and the same applies hereinafter) diodes connected in parallel. Note that each of the diodes D01 and D03 is a single diode.

The reference voltage generating circuit 41 operates as a bandgap reference voltage generating circuit. The reference voltage generating circuit 41 outputs the reference voltage VBGREF, which has undergone temperature compensation shown by a below formula (1).

$$VBREF = V_{D03} + V_{diff} \times \left(\frac{R2}{R1}\right) \quad (1)$$

Note that VD03 is the voltage (negative temperature coefficient) at both ends of the diode D03, and Vdiff is the difference between the voltages applied to both ends of the diodes D01 and D02 (in other words, positive temperature coefficient). For example, if the power source voltage VDD is 1.8 V, the reference voltage VBGREF is 0.8 V.

Figure 1:
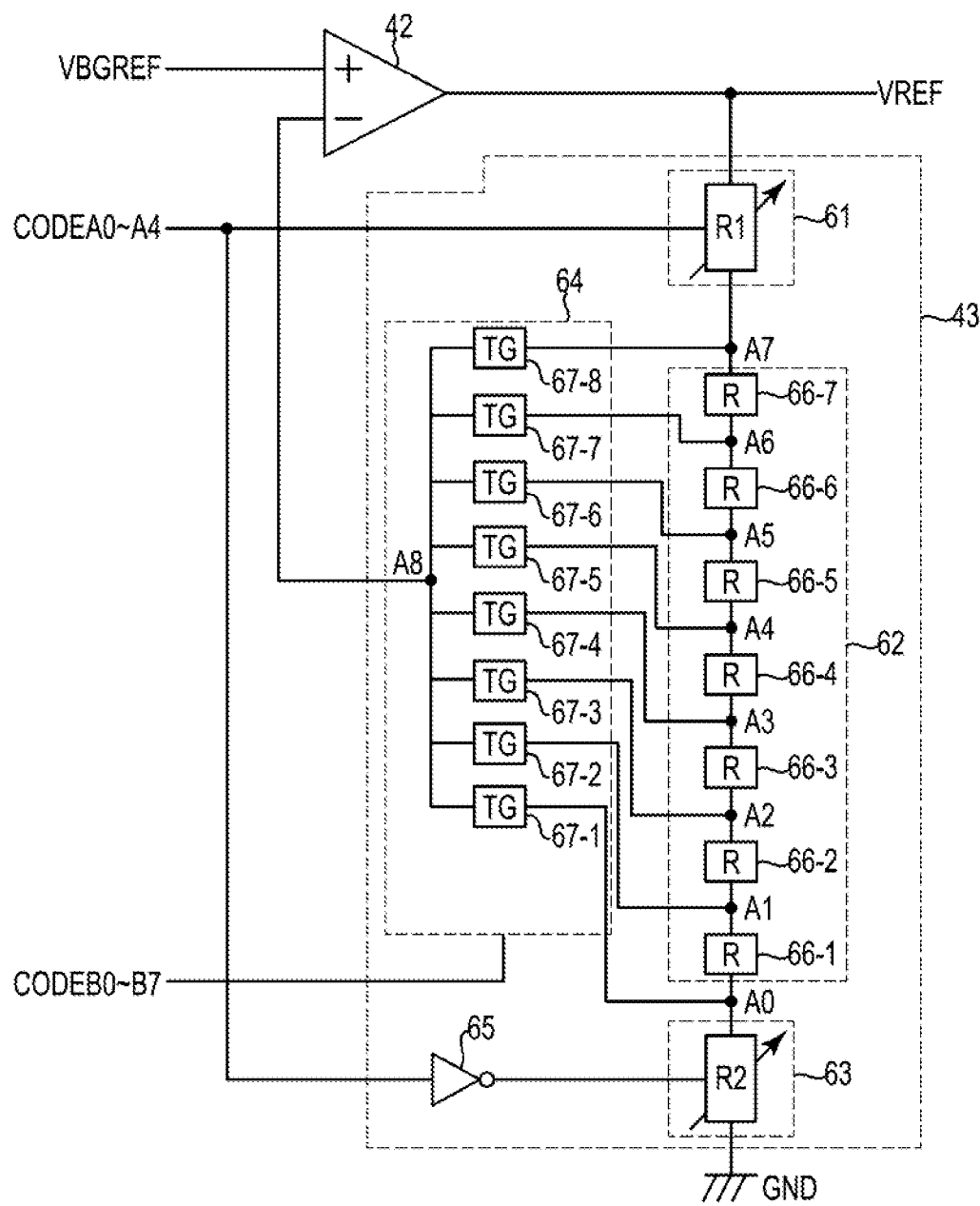
FIG. 1 is a drawing showing an example of the circuit configuration of a voltage adjusting circuit included in a reference voltage generating circuit according to a first embodiment.

FIG. 1 is a drawing showing a voltage adjusting circuit 43 according to an embodiment of the invention. The voltage adjusting circuit 43 includes a first resistance circuit 61 (variable resistance circuit), a second resistance circuit 62, a third resistance circuit 63 (additional resistance circuit), a selecting circuit 64 and an inverter circuit 65. The term "resistance selecting circuit" may be used to refer to the combination of the second resistance circuit 62 and the selecting circuit 64.

The first resistance circuit 61, the second resistance circuit 62 and the third resistance circuit 63 are connected in series between the output terminal of the differential amplifying circuit 42 and the ground voltage VSS. Although details will be described later, a plurality of resistances are connected in series to the first resistance circuit 61, and whether each of the resistance values thereof is to be enabled or disabled (whether to bypass the resistance or not) is configured to be controllable by the adjustment code A (CODE A).

The basic configuration of the third resistance circuit 63 is similar to the configuration of the first resistance circuit 61. Note that the signal of the logic level of the adjustment code A inverted by the inverter circuit 65 is supplied to the third resistance circuit 63. In other words, the adjustment codes supplied to the first resistance circuit 61 and the third resistance circuit 63 are in a mutually complementary relation.

The second resistance circuit 62 includes seven resistors 66-1 to 66-7 connected in series. Each of intermediate nodes connecting the mutually adjacent resistor 66 is connected to the selecting circuit 64. Regarding the both ends of the resistor string such as the resistor 66-1 and the resistor 66-7, the nodes connected with the third resistance circuit 63 and the first resistance circuit 61 are connected to the selecting circuit 64.

Note that, in the description hereinafter, the connection node of the third resistance circuit 63 and the resistor 66-1 will be described as A0. The intermediate nodes in the second resistance circuit 62 will be described as A1 to A6. The connection node of the first resistance circuit 61 and the resistance 66-7 will be described as A7. The connection node of the selecting circuit 64 and the differential amplifying circuit 42 will be described as A8. Furthermore, the resistance value obtained from the first resistance circuit 61 will be described as R1, the resistance value obtained from the third resistance circuit 63 will be described as R2, and each of the resistance values of the resistors 66 included in the second resistance circuit 62 will be described as R.

Figure 5:
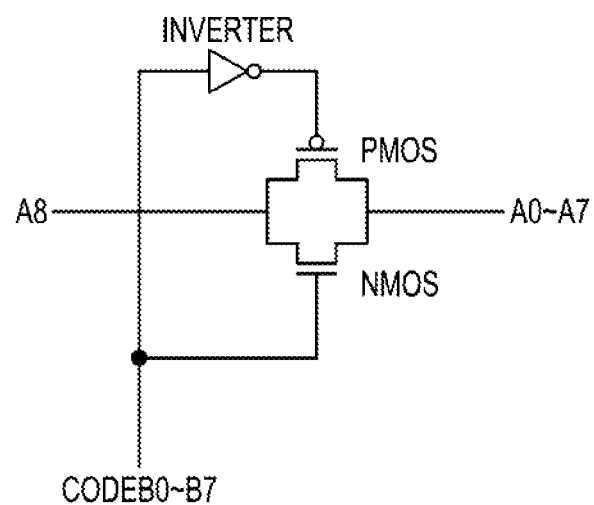
FIG. 5 is a drawing showing an example of the circuit configuration of a gate circuit.

The selecting circuit 64 is a circuit for selecting a node(s) to be connected to the differential amplifying circuit 42 among the nodes A0 to A07. The selecting circuit 64 includes eight gate circuits 67-1 to 67-8. Each of the gate circuits 67 includes a P-channel-type MOS transistor and an N-channel-type MOS transistor as shown in FIG. 5 and is turned on/off by the adjustment code B serving as a control signal.

Figure 6:
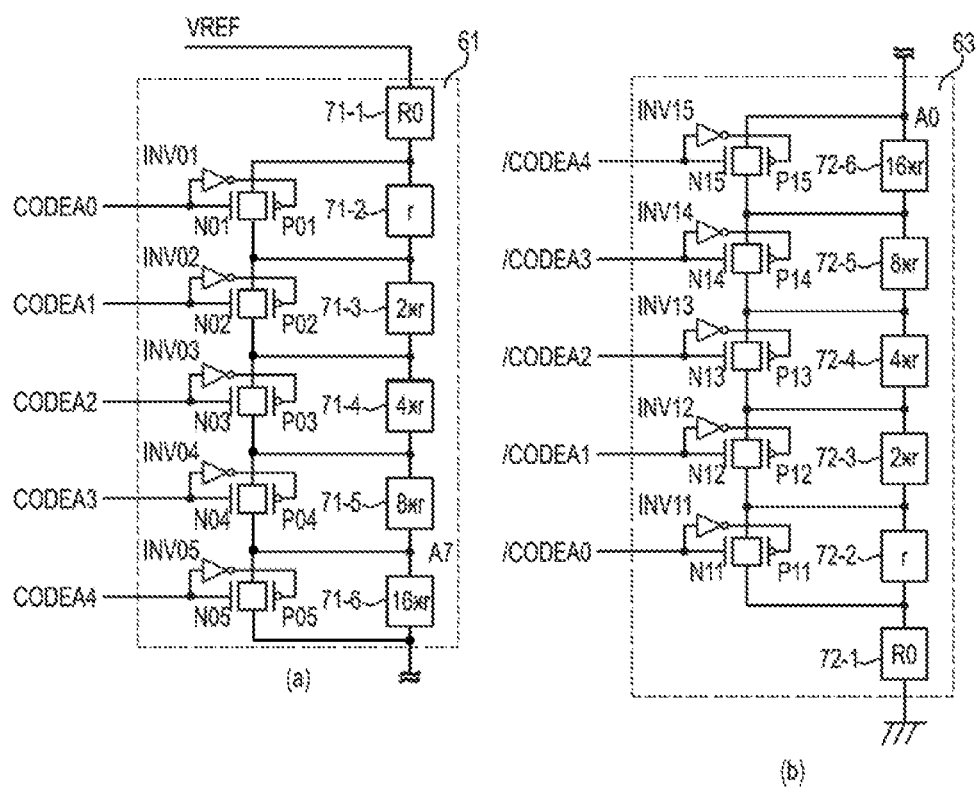
FIG. 6 is a drawing showing an example of the circuit configuration of a first resistance circuit and a third resistance circuit.

FIG. 6 is a drawing showing a first resistance circuit 61 and the third resistance circuit 63 according to an embodiment of the invention. In FIG. 6 (*a*), the first resistance circuit 61 includes resistors 71-1 to 71-6 connected in series. Gate circuits for short-circuiting both ends of the resistors are connected in parallel to the resistors of the resistors 71-2 to 72-6. Each of the gate circuits includes a P-channel-type MOS transistor and an N-channel-type MOS transistor and is turned on/off by the adjustment code A. Note that each of the gate circuits can be considered as a switch for bypassing the corresponding resistor.

In FIG. 6 (b), the third resistance circuit 63 includes resistors 72-1 to 72-6 connected in series. Gate circuits corresponding to the resistors 72-1 to 72-6 included in the third resistance circuit 63 are also connected in parallel. However, as described above, the logic level of the adjustment code A supplied to the third resistance circuit 63 is inverted by the inverter circuit 65. Therefore, in FIG. 6 (b), the adjustment code A supplied to each of the gate circuits is denoted with "/" representing a complementary signal of the adjustment code A.

Note that, the resistance values of the resistors 71-1 and 72-1 are described as R0, and the resistance values of the resistors 71-2 and 72-2 are described as r to give the description hereinafter. The resistance values of the resistors 71-2 to 71-6 are in a relation of power multiplication. Specifically, if the resistance value of the resistor 71-2 is r, the resistance value of the resistor 71-3 is $r\times2^1=2\times r$, and the resistance value of the resistor 71-4 is $r\times2^2=4\times r$. The relationship of the resistors 72-2 to 72-6 is also similar and is set so that the resistors connected in series sequentially have the resistance values of the powers of two.

In this manner, in the first resistance circuit 61, the resistances having the resistance values of 2 to the power of 0 to 2 to the power of n (in the first embodiment, n=4) are connected in series, and the resistors are provided with gate circuits, respectively. A similar manner is applied to the resistors 72-2 to 72-6 included in the third resistance circuit 63. However it is applicable to equalize resistance values of the resistors each other.

Next, with reference to FIG. 1 and FIG. 6, operation of the voltage adjusting circuit 43 will be described.

In FIG. 1, the selecting circuit 64 is configured so that the adjustment code B can be input thereto. Based on the adjustment code B, the selecting circuit 64 determines a transfer gate(s) 67 to be turned on among the eight gate circuits 67. Adjustment codes B0 to B7 enable the operations of selecting the nodes A0 to A7, and the selecting circuit 64 is configured so that, if the particular adjustment code B takes a High level, the corresponding gate circuit 67 is turned on.

For example, if the adjustment code B0 is at the High level, the gate circuit 67-1 is turned on. The relationships between the other adjustment codes B and the gate circuits 67 are also similar. For example, if the adjustment code B7 is at the High level, the gate circuit 67-8 is turned on. Note that, since a plurality of nodes are not selected among the nodes A0 to A7 and are not connected to the differential amplifying circuit 52, also regarding the adjustment code B, one of the adjustment codes B0 to B7 takes the H level, and each of the others takes a Low level.

In FIGS. 6 (a) and (b), the adjustment code A is supplied to the first resistance circuit 61, and inverted adjustment code A is supplied to the third resistance circuit 63.

The first resistance circuit 61 can adjust the resistance value R1 (the resistance value of the entire first resistance circuit 61) in 32 levels by the adjustment code A. Specifically, the gate circuits respectively corresponding to the resistors 71-2 to 71-6 are turned on/off by adjustment codes A0 to A4. For example, the gate circuit corresponding to the resistor 71-2 is turned on when the adjustment code A0 takes the High level.

A maximum value R1max of the resistance value R1 is obtained when all of the adjustment codes A0 to A4 are at the Low level. When all of the adjustment codes A0 to A4 are at the Low level (CODE A=00000), all of the both ends of the resistors 71-2 to 72-6 are not short-circuited, the resistance value R1max therefore becomes R0+31r.

If the adjustment code A is incremented and the adjustment code A0 takes the High level (CODE A=00001), the gate circuit corresponding to the resistor 71-2 is turned on, and the resistance value r of the resistor 71-2 is substantially disabled. Therefore, the resistance value R1 is reduced to R0+30r.

In this manner, as the value of the adjustment code A is incremented, the resistance value R1 is reduced by a step width r and is adjusted in the 32 levels.

A minimum value R1min of the resistance value R1 is obtained when all of the adjustment codes A0 to A4 are at the High level (CODE A=11111). This is for a reason that, when all of the adjustment codes A0 to A4 are at the High level, both ends of the resistors 71-2 to 71-6 are short-circuited. In this case, the resistance value R1min becomes substantially equal to R0.

The third resistance circuit 63 can adjust the resistance value R2 (the resistance value of the entire third resistance circuit 63) in 32 levels by the complementary signals (/CODE A) of the adjustment code A. Specifically, the gate circuits respectively corresponding to the resistors 72-2 to 72-6 are turned on/off by the complementary adjustment codes A0 to A4.

A minimum value R2min of the resistance value R2 is obtained when all of the adjustment codes A0 to A4 are at the Low level (CODE A=00000; /CODE A=11111). Since all of the adjustment codes /A0 to /A4 are at the High level, the both ends of the resistors 72-2 to 72-6 are short-circuited, and the resistance value R2min becomes R0.

When the adjustment codes A0 to A4 are incremented and the adjustment code A0 takes the High level (CODE A=00001; /CODE A=11110), the gate circuits corresponding to the resistors 72-3 to 72-6 are turned on, and the gate circuit corresponding to the resistor 72-2 is turned off. Therefore, the resistance values of the resistors 72-3 to 72-6 are substantially disabled, and the resistance value R2 becomes substantially equal to R0+r.

In this manner, as the value of the adjustment code A is incremented, the resistance value R2 is increased by the step width r and is adjusted in 32 levels.

Note that a maximum value R2max of the resistance value R2 is obtained when all of the adjustment codes A0 to A4 are at the High level (CODE A=11111; /CODE A=00000). This is for a reason that, in this case, the gate circuits corresponding to the resistance values of the resistors 72-2 to 72-6 are turned off.

In this manner, the first resistance circuit 61 and the third resistance circuit 63 turn on/off the gate circuits therein by the mutually complementary signals. Therefore, there is a relationship that, if the resistance value of one of the first resistance circuit 61 and the third resistance circuit 63 is increased, the resistance value of the other of the first resistance circuit 61 and the third resistance circuit 63 is reduced. The sum of the resistance value R1 and the resistance value R2 is constant regardless of the value of the adjustment code A. Specifically, the sum of the resistance value R1 and the resistance value R2 becomes 2R0+31r.

As described above, the sum of the resistance value R1 and the resistance value R2 is 2R0+31r, which is constant. On the other hand, the resistance value of the second resistance circuit 62 is 7R. Therefore, the resistance value of the resistors connected between the reference voltage VREF and the ground voltage VSS becomes 7R+2R0+31r, which is constant regardless of the adjustment codes A and B.

On the other hand, when the adjustment code A is incremented, the resistance value R2 is changed in the range of R0≤R2≤R0+31r. Since the adjustment code B is a code that determines the node among the nodes of the nodes A0 to A7 to be connected to the differential amplifying circuit 42, the resistance value between the node A0 and the node selected by the adjustment code B is in eight levels of 0 (when the node A0 is selected) to 7R (when the node A7 is selected).

Therefore, a voltage VA8 of the node A8 can be calculated by the following formula (2).

$$V_{A8} = \frac{R2 + m \times R}{R1 + R2 + 7R} \times VREF = \frac{R2 + m \times R}{7R + 2R0 + 31r} \times VREF \quad (2)$$

In this formula, m is an integer matching the number of the selected node.

Since the differential amplifying circuit 42 carries out an amplifying operation so as to equalize the voltages of the non-inverting input terminal and the inverting input terminal, the reference voltage VREF becomes as described in the following formula (3).

$$VREF = \frac{R1 + R2 + 7R}{R2 + m \times R} \times VBGREF \quad (3)$$

Herein, the formula (2) and the formula (3) show that, when the resistance value R has a comparatively large value and the resistance value r has a comparatively small value, the voltage VA8 of the node A8 and the reference voltage VREF are roughly adjusted by the adjustment code A and are finely adjusted by the adjustment code B.

For example, the resistance value R=100 kΩ, the resistance value R0=200 kΩ, and the resistance value r is 3.125 kΩ. Note that the resistance value r results from finely adjusting 100 kΩ in 32 levels (100 kΩ÷32=3.125 kΩ). Therefore, the resistance value R and the resistance value r has a proportional relationship, for example, if the resistance value R=200 kΩ, the resistance value r=6.26 kΩ.

In this case, for example, the numerator of formula (2) can be adjusted in 8 levels respectively by 100 k within the range of the resistance value R2 (m=0) to the resistance value (R2+700 kΩ; m=8) by the adjustment code B (the selecting circuit 64).

On the other hand, the resistance value R2 can be adjusted in 32 levels respectively by 3.125 kΩ within the range of 200 kΩ (R0) to 296.875 kΩ (R0+31r) by the adjustment code A. Therefore, the voltage VA8 and the reference voltage VREF are roughly adjusted by the adjustment code B and are finely adjusted by the adjustment code A.

The voltages of the nodes A0 to A7 become comparatively high voltages when a current flows to the voltage adjusting circuit 43. However, since the gate circuits 67 included in the selecting circuit 64 are not like the gate circuit that short-circuits both ends of a resistor, the necessary amount of current is limited to a transitional charging current to the inverting input terminal of the amplifying circuit 42. Therefore, even if the transfer gates 67 are not sufficiently turned on since the voltages of the nodes A0 to A7 are comparatively high voltages, the voltage of the node A8 can be appropriately controlled.

The switches of the selecting circuit 64 are implemented by the gate circuits 67. Therefore, for example, even if a threshold voltage Vt is varied at the gate circuit 67-5 corresponding to the node A4 expected to have a comparatively high source voltage, the variations of the threshold voltage Vt can be absorbed since either one of the P-channel-type MOS transistor and the N-channel-type MOS transistor is turned on.

Furthermore, the first resistance circuit 61 is close to the reference voltage VREF, and the third resistance circuit 63 is close to the ground voltage VSS; therefore, the source voltages of the gate circuits included in the region thereof are comparatively low voltages. Therefore, the situation that a necessary voltage between the gate and source thereof cannot be ensured due to increase of the source voltages of the gate circuits and that the conductance of the gate circuits becomes insufficient can be avoided. Thus, at the first resistance circuit 61 or the third resistance circuit 63, both ends of each resistor can be short-circuited while the gate circuit is in a sufficiently low resistance state regardless of variations of a threshold voltage Vth. As a result, feedback of the reference voltage VREF by the voltage adjusting circuit 43, which is constant to the instructions of the adjustment codes A and B, is carried out, and the reference voltage VREF output by the differential amplifying circuit 42 is stabilized.

Since the sum of the resistance values of the first resistance circuit 61 and the third resistance circuit 63 is constant regardless of the adjustment code A, the step amount of a feedback gain becomes constant. Therefore, the number of total steps is not required to be significantly increased, and adjustment of the reference voltage VREF can be carried out with high accuracy.

[Second Embodiment]

Subsequently, a second embodiment will be described in detail with reference to drawings.

In the first embodiment, the voltage of the node A8 is finely adjusted by supplying the adjustment code A to the first resistance circuit 61 and the third resistance circuit 63. In the second embodiment, one of the resistance circuits is used to finely adjust the voltage of the node A8.

Figure 7:
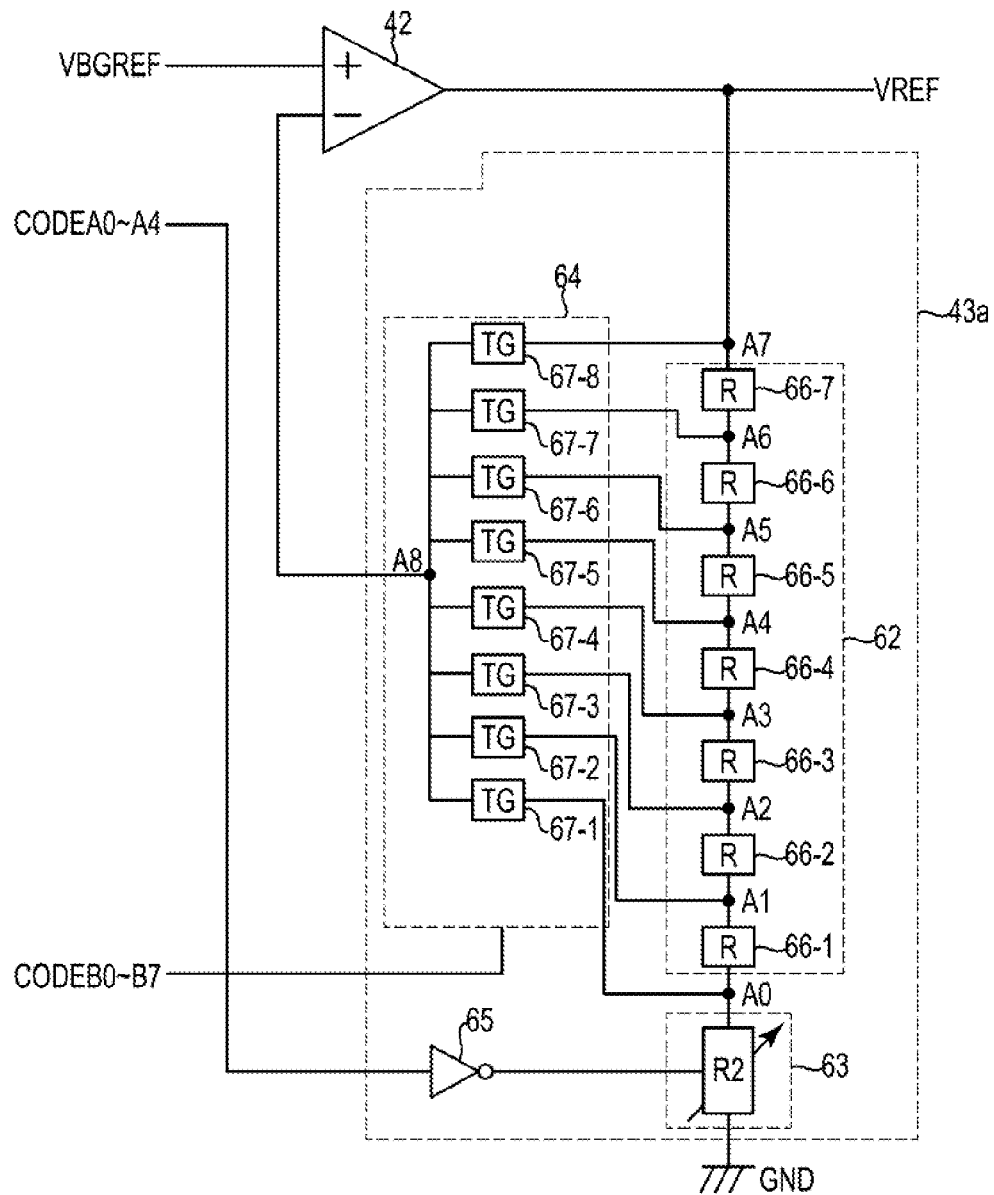
FIG. 7 is a drawing showing an example of the internal configuration of a voltage adjusting circuit according to a second embodiment.
Figure 8:
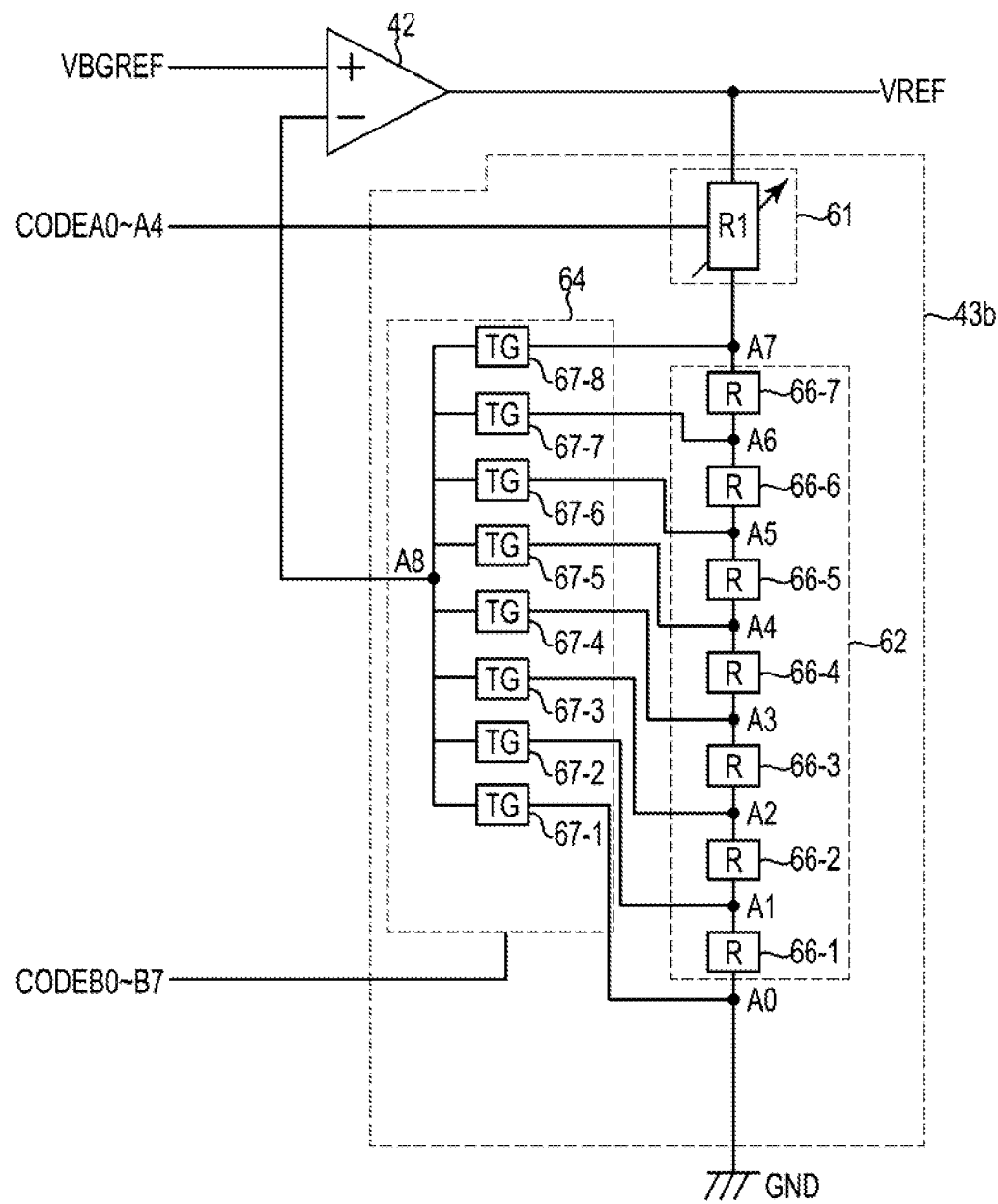
FIG. 8 is a drawing showing another example of the internal configuration of the voltage adjusting circuit according to the second embodiment.

FIG. 7 is a drawing a voltage adjusting circuit 43a according to an embodiment of the invention. FIG. 8 is a drawing showing a voltage adjusting circuit 43b according to an embodiment of the invention. In FIG. 7 and FIG. 8, the constituent elements which are the same as those of FIG. 1 are denoted by the same reference signs, and the explanations thereof are omitted.

The configuration of FIG. 7 is a configuration from which the first resistance circuit 61 is not included in the voltage adjusting circuit 43 according to the first embodiment. The configuration of FIG. 8 is a configuration from which the third resistance circuit 63 is not included in the voltage adjusting circuit 43. Therefore, except for the operation that, if the resistance value of either one of the voltage adjusting circuits 43a and 43b is increased, the resistance value of the other one is reduced, the operation thereof matches the operation of the voltage adjusting circuit 43.

Since the operation that, if the resistance value of one of them is increased, the resistance value of the other one is reduced is not carried out, in the voltage adjusting circuits 43a and 43b, the resistance value in the circuit is not fixed, and the step amount of the feedback gain is not constant. However, since the first resistance circuit 61 or the third resistance circuit 63 is disposed in the region in which the source voltage is not increased, the situation that the necessary voltage between the gate and source cannot be ensured due to increase of the source voltage of the gate circuit and that the conductance of the gate circuit becomes insufficient can be avoided similarly to the first embodiment.

Note that the circuit configurations, etc. described in the first and second embodiments are examples, and various modifications are also included in the scope of the present invention.

For example, the adjustment code A has been described to be 5 bits, and the adjustment code B has been described to be 8 bits; however, as a matter of course, the number of the bits of the adjustment codes are arbitrarily changed depending on the configuration of the voltage adjusting circuit 43.

The gate circuits 67 have been shown as the node selecting circuits in the selecting circuit 64. However, all or part of the node selecting circuits can be formed by a P-channel-type MOS transistor(s) and an N-channel-type MOS transistor(s). For example, in a possible configuration, the N-channel-type MOS transistor(s) is used in the region close to the ground voltage VSS, the P-channel-type MOS transistor(s) is used in the region close to the reference voltage VREF, and a gate circuit(s) is used in an intermediate region (the region most distant from the ground voltage VSS and also from the reference voltage VREF).

The circuit configuration of the first resistance circuit 61 or the third resistance circuit 63 can be the configuration of the voltage adjusting circuit 43. More specifically, the mechanism of rough adjustment supporting large gain changes and the mechanism of fine adjusting supporting small gain changes can be incorporated in the first resistance circuit 61, etc.

The disclosure of the above described cited patent literatures is incorporated herein by reference. Within the range of all the disclosure (including claims) of the present invention and based on the basic technical ideas thereof, the embodiments or examples can be changed/adjusted. Within the range of all the disclosure of the present invention, various disclosure elements (including the elements of claims, the elements of the embodiments or examples, the elements of the drawings, etc.) can be variously combined or selected. Thus, it goes without saying that the present invention includes various modifications and adjustments that can be made based on all the disclosure including claims and the technical ideas by those skilled in the art. Particularly, the ranges of the numerical values described in the present specification should be interpreted that arbitrary numerical values or small ranges included in the ranges are described in detail unless otherwise described.

What is claimed is:

1. A device comprising:
   an amplifying circuit having first and second input terminals and an output terminal;
   a ground terminal;
   a variable resistance circuit including a plurality of resistors coupled in series, at least three resistors of the plurality of resistors having different resistance values; and
   a resistance selecting circuit coupled in series to the variable resistance circuit between the output terminal and the ground terminal, the resistance selecting circuit including a first node coupled to the second input terminal, a plurality of resistors coupled in series to each other and a plurality of gate circuits each coupled between the first node and one end of a corresponding one of the resistors.

2. The device as claimed in claim 1, further comprising a reference voltage generating circuit configured to supply a reference voltage to the first input terminal of the amplifying circuit, wherein the reference voltage is substantially stable regardless of a thermal change on the device.

3. The device as claimed in claim 1, further comprising:
   a memory cell array operable by an internal voltage; and
   an internal voltage generating circuit configured to generate the internal voltage based on a voltage supplied to the output terminal of the amplifying circuit.

4. The device as claimed in claim 1, wherein the plurality of gate circuits of the resistance selecting circuit are configured to be controlled to have a selected one of the gate circuits closed and the other or others of the gate circuits opened.

5. The device as claimed in claim 1, wherein the plurality of gate circuits of the resistance selecting circuit includes transistors coupled between the first node and the second nodes, respectively.

6. The device as claimed in claim 5, further comprising a code storing circuit configured to supply code signals to gates of the transistors, respectively.

7. The device as claimed in claim 1, wherein the variable resistance circuit is coupled between the output terminal and the resistance selecting circuit and the resistance selecting circuit is coupled between the variable resistance circuit and the ground terminal.

8. The device as claimed in claim 1, wherein the resistance selecting circuit is coupled between the output terminal and the variable resistance circuit and the variable resistance circuit is coupled between the resistance selecting circuit and the ground terminal.

9. The device as claimed in claim 7, further comprising an additional variable resistance circuit coupled between the resistance selecting circuit and the ground terminal.

10. A device comprising:
    an amplifying circuit configured to be supplied with first and second voltages and to generate a third voltage responsive to a voltage comparison between the first and second voltages;
    a variable resistance circuit configured to be supplied with the third voltage and to supply a fourth voltage different from the third voltage; and
    a resistance selecting circuit configured to be supplied with the fourth voltage and to generate a plurality of internal voltages different from each other based on the fourth voltage, the resistance selecting circuit further configured to output a selected one of the internal voltages as the second voltage to the amplifying circuit.

11. The device as claimed in claim 10, further comprising a reference voltage generating circuit configured to generate a reference voltage that is substantially stable regardless of a thermal change on the device as the first voltage.

12. The device as claimed in claim 10, wherein the resistance selecting circuit includes a plurality of internal nodes to which the internal voltages are supplied, an output node to which the selected one of the internal voltages is supplied, and a plurality of gate circuits each coupled between a corresponding one of the internal nodes and the output node.

13. The device as claimed in claim 12, wherein the plurality of gate circuits are configured to be controlled such that a selected one of the plurality of gate circuits is closed and at least one of the other gate circuits of the plurality of gate circuits is opened.

14. The device as claimed in claim 10, wherein the resistance selecting circuit is further configured to supply a fifth voltage different from the fourth voltage and the device further comprises an additional variable resistance circuit configured to be supplied with the fifth voltage and a ground voltage.

15. The device as claimed in claim 14, wherein the variable resistance circuit and the additional variable resistance element are configured to be controlled such that a sum of resistance values of the variable resistance circuit and the additional variable resistance circuit is substantially stable.

* * * * *